United States Patent [19]

Mahajan et al.

[11] 4,421,786
[45] Dec. 20, 1983

[54] CHEMICAL VAPOR DEPOSITION REACTOR FOR SILICON EPITAXIAL PROCESSES

[75] Inventors: Roop L. Mahajan, Lawrenceville; Joseph R. Ristorcelli, Jr., Belle Mead, both of N.J.

[73] Assignee: Western Electric Co., New York, N.Y.

[21] Appl. No.: 383,881

[22] Filed: Jun. 1, 1982

Related U.S. Application Data

[62] Division of Ser. No. 227,873, Jan. 23, 1981, abandoned.

[51] Int. Cl.³ .......................................... H01L 21/02
[52] U.S. Cl. .................................. 427/82; 427/248.1; 427/255; 118/725; 118/728; 156/613; 156/611
[58] Field of Search ...................... 427/248.1, 82, 255, 427/50, 51; 118/715, 724, 725, 726, 728, 729, 730, 500; 156/611, 612, 613

[56] References Cited

U.S. PATENT DOCUMENTS

| | | | |
|---|---|---|---|
| 3,384,049 | 5/1968 | Capita | 118/725 |
| 3,623,712 | 11/1971 | McNeilly et al. | 34/4 |
| 3,696,779 | 10/1972 | Murai et al. | 118/730 X |
| 3,757,733 | 9/1973 | Reinberg | 118/725 X |
| 3,783,822 | 1/1974 | Wollam | 118/730 X |
| 3,796,182 | 3/1974 | Rosler | 118/730 X |
| 3,884,642 | 5/1975 | Benedict | 23/273 SP |
| 3,935,412 | 1/1976 | McDonough et al. | 219/10.47 |
| 4,047,496 | 9/1977 | McNeilly et al. | 427/255 X |
| 4,061,800 | 12/1977 | Anderson | 427/46 |
| 4,173,661 | 11/1979 | Bourdon | 427/39 |
| 4,207,137 | 6/1980 | Tretola | 156/627 |
| 4,282,267 | 8/1981 | Kuyel | 427/38 |

FOREIGN PATENT DOCUMENTS

| | | | |
|---|---|---|---|
| 1518843 | 2/1968 | France | 118/49 |
| 476022 | 11/1975 | U.S.S.R. | 118/228 |

OTHER PUBLICATIONS

"Chemical Vapor Deposition Reactor", S. Chem., NASA Tech. Brief, vol. 4, Item 62, Aug. 1979.

*Primary Examiner*—John D. Smith
*Assistant Examiner*—Bernard F. Plantz
*Attorney, Agent, or Firm*—D. J. Kirk

[57] ABSTRACT

A chemical vapor deposition reactor (40) is disclosed. The reactor (40) has a vertically mounted tube (43), axially disposed within a chamber (41). A plurality of spaced, planar, wafer holders (44—44), having resistance heated portions (45—45) thereon, are fixedly mounted to and radially extend from the tube (43). Silicon wafers (13—13) are placed on the resistance heated portions of the holders (44—44) and reactant gases are caused to radially flow through apertures (91—91) in the tube (43), between adjacent heated holders (44—44) and across the surface of the wafers (13—13) to deposit doped silicon thereon. Undeposited reactants and gases are removed via an axisymmetric exhaust port 81.

2 Claims, 3 Drawing Figures

# CHEMICAL VAPOR DEPOSITION REACTOR FOR SILICON EPITAXIAL PROCESSES

This is a division of application Ser. No. 227,873 filed Jan. 23, 1981, now abandoned.

TECHNICAL FIELD

The instant invention relates to chemical vapor deposition. In particular, the invention is directed to chemical vapor deposition method for semiconductor epitaxial deposition processes.

BACKGROUND OF THE INVENTION

In semiconductor epitaxial processes, it is required to deposit a layer of doped material of uniform thickness and concentration on a semiconductor wafer. At least three major reactor systems have been used to implement the epitaxial process: (a) barrel, (b) horizontal, and (c) "pancake" reactor systems.

In the barrel reactor, a barrel-like holder is rotatably mounted about its vertical axis within a deposition chamber. The semiconductor wafers are placed (on a small angle from vertical) on the outer surface of the barrel which is rotated as reactant gas flows thereacross in a vertical direction. The wafers may be RF heated or radiantly heated by a battery of quartz lamps, located outside the chamber, to promote epitaxial growth thereon. One such barrel reactor is disclosed in U.S. Pat. No. 3,796,182.

In the horizontal reactor, a susceptor, having the wafers thereon, is placed in an elongated horizontal chamber and reactant gases passed therealong. The susceptor is tilted at an angle of about 2° to accelerate the bulk flow to make the streamwise deposition more uniform. The susceptor is heated inductively which, in turn, heats the wafers to promote epitaxial growth thereon. A typical horizontal reactor is described in U.S. Pat. No. 4,047,496. A two level horizontal reactor is described in an article titled "Chemical-Vapor-Deposition Reactor" S. S. Chern, NASA Technical Support Package, dated August 1979.

The "pancake" type reactor is comprised of a substantially circular, planar susceptor rotatably mounted on a hollow, axially located, shaft. The susceptor, with wafers positioned thereon, is rotated within a chamber and reactant gases are radially directed across the wafers as the susceptor is heated using an RF source placed within the chamber immediately below the susceptor. An example of such a reactor is shown in U.S. Pat. No. 3,757,733.

Although the above-described reactors have proven effective for forming epitaxial thicknesses and dopant concentrations on three inch diameter wafers or less, problems arise when processing larger diameter wafers. Semiconductor wafers on the order of four inches in diameter and larger are being fabricated along with new semiconductor devices which place more stringent requirements on the epitaxial layer deposition and dopant concentrations resulting in a substantial decrease in the tolerance acceptability in epitaxial deposition. For example, maintaining the desired wafer flatness and uniform temperature across the wafer diameter are substantially more difficult to accomplish on the larger diameter wafers.

In addition to the more stringent standards of epitaxial layer thickness uniformity and dopant concentration, it is anticipated that rapid increases in semiconductor device production will occur over the next few years. Accordingly, due to the aforementioned stringent manufacturing standards, wafer size and anticipated increase in semiconductor device production there is a need for new chemical vapor deposition technique which will provide a much higher throughput and improved quality control.

SUMMARY OF THE INVENTION

The instant method of depositing a thin film of material on a plurality of semiconductor wafers meets the foregoing requirements. The method comprises the steps of placing the wafers on resistance heated portions on each of a plurality of vertically spaced parallel, planar wafer holders, said heated portions being vertically aligned and the holders having a centrally disposed perforated tube passing therethrough; directing a gaseous reactant material through the perforated tube between the wafer holders and over the surface of the wafers; and activating the resistance heated portions to conductively and radiatively heat the wafers to deposit a thin film of the reactant material thereon.

DETAILED DESCRIPTION

The instant invention is disclosed in terms of a chemical vapor deposition (CVD) reactor for epitaxial deposition of doped silicon layers on a silicon substrate. However, such description is for purposes of exposition and not for limitation for the instant reactor can be used to deposit various types of materials such as $SiO_2$ on different types of substrates.

Figure 1:
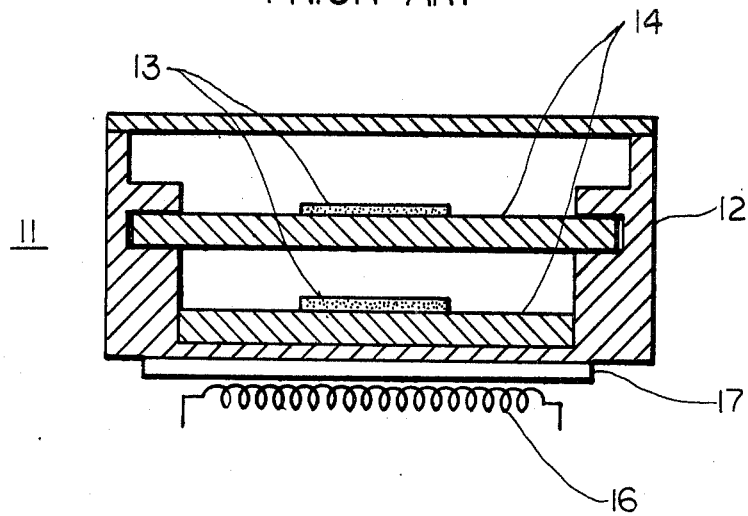
FIGS. 1 and 2 are schematic drawings of prior art horizontal and pancake type reactors, respectively.

FIG. 1 is a cross-sectional view of a portion 11 of the horizontal CVD reactor 12 set forth in the above-referred to NASA article. A semiconductor wafer 13 is placed on each of two vertically stacked trays 14—14 and an electrical heater 16 and a hot plate 17 are located proximate the bottom of the reactor 12. In operation, the heater 16 (which can be an RF heater) and the hot plate are activated as a reactant gas flows across the wafers 13—13 (i.e., in a plane normal to the drawing sheet) wherein the gas reacts with the heated wafers 13—13 to grow an epitaxial layer (not shown) thereon.

Figure 2:
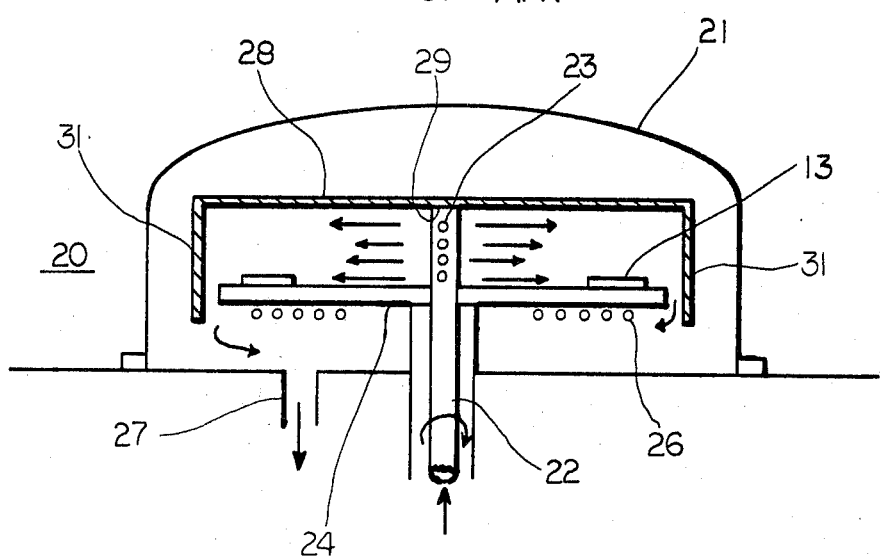

FIG. 2 is a schematic drawing of a prior art "pancake" type reactor, generally indicated by the numeral 20. The pancake reactor 20 is comprised of sealed chamber 21 having a centrally located, rotatably mounted inlet tube 22 therein, the tube having a plurality of apertures 23—23 in the upper portion thereof. The tube 22 passes through the central portion of a circular, planar susceptor 24. A plurality of RF coils 26 are mounted below the susceptor 24 and an exhaust port 27 is located in the base of the chamber 20. A gas shield 28 is supported on end 29 of the tube 22 with sides 31 radially spaced from the periphery of the susceptor 24. In operation, the silicon wafers 13—13 are placed on the susceptor 24. The tube 22 is rotated (see arrow) which in turn causes the susceptor 24 to rotate as reactant gas is directed through the tube, through the apertures 23, across the wafers 13 and out the exhaust port 27. Simultaneously, the RF coils 26 are activated to inductively heat the susceptor 24 which, in turn, heats the wafers 13—13 to promote epitaxial growth thereon.

Although the aforementioned techniques work well, because of the stringent requirements of epitaxial layer thickness uniformity and dopant concentration, as well as the need for increased production, of larger size wafers 13, new techniques and apparatus are required.

Figure 3:
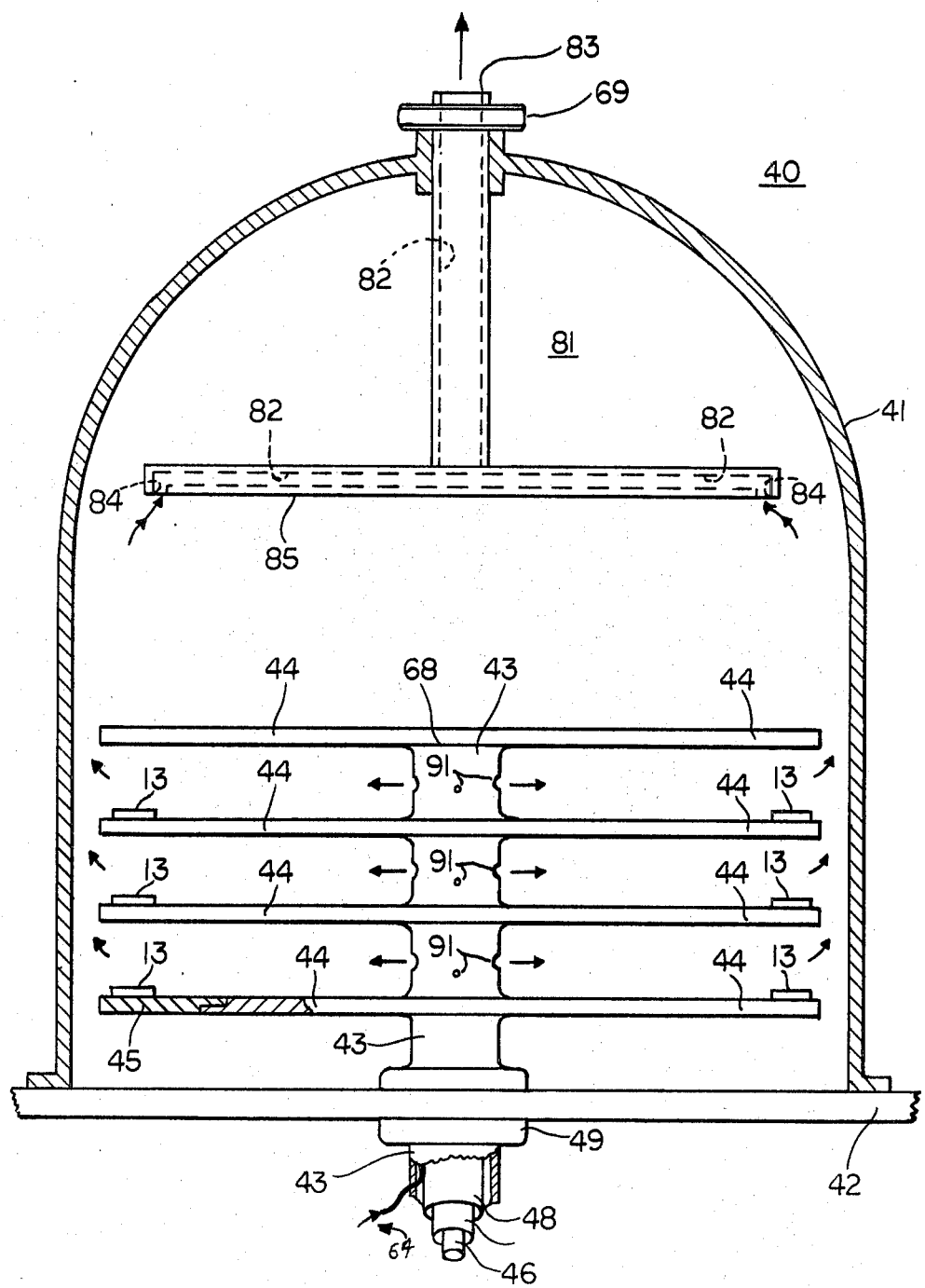
FIG. 3 is a schematic drawing of a reactor incorporating the instant inventive concepts.

The instant apparatus, generally designated by the numeral 40, is shown in FIG. 3. The apparatus 40 is comprised of a bell shaped housing 41 sealably mounted on a base 42. A substantially cylindrical, hollow central support member 43 is located along the central axis of the housing 41. A plurality of planar, circular wafer holders 44—44, each having a substantially annular shaped, resistance heater 45 on the outer periphery thereof, are fixedly mounted in spaced, parallel, relation on the support member 43 and radially extend therefrom. A plurality of concentric tubes 46, 47 and 48 of different lengths and diameter are inserted one inside the other and positioned within the hollow central support member 43. A lock nut 49 secures the central support member 43 to the base 42. A plurality of wire pairs 64—64 pass along the inside of the support member 43, exit (not shown) through holders 44—44 and terminate at the resistance heaters 45—45 at each level.

An axisymmetric gas exhaust member, generally designated by the numberal 81, having an inverted "T" cross section wherein the leg of the "T" is a hollow cylinder which extends through the top of the housing 41 and is held in place by a nut 69. The exhaust member 81 has a channel 82 therein which permits gas within the housing 41 to pass therethrough and exit to a gas scrubber (not shown) from an end 83 of the exhaust member. The channel 82 has a ring shaped or annular input port 84 in a planar, circular member 85.

In operation, a plurality of silicon wafers 13—13 are placed on the electrical resistance heaters 45—45 associated with each of holders 44—44. The heaters 45—45 are activated via an electrical connection (not shown) to the wire pairs 64—64 to heat the wafers 13—13. A carrier gas (e.g., hydrogen), from a source not shown, carrying a silicon source and a dopant is directed into and through the tubes 46, 47 and 48, each tube bringing an individually controlled amount of gas to a different level. The gas then passes through a plurality of apertures 91—91 in the support member 43, across the surface of the wafers 13—13 and out the axisymmetric exhaust member 81 as indicated by the arrows. The gas, upon coming in contact with the heated wafers 13—13, reacts to deposit a doped silicon layer thereon.

Advantageously, by using the resistance heaters 45—45 to heat the wafers 13—13 and withdrawing the undeposited reactants from the housing 41 in a uniform flow pattern by using the axisymmetric exhaust member 81 with the annular input port 84 it is not necessary to rotate the holders 44—44. Elimination of such rotation while insuring uniformity of heating and deposition makes for a simplified, high throughput, reactor. Additionally, such a reactor is much safer to operate due to the elimination of coupling apparatus to connect rotating portions to other rotating and/or non-rotating portions which present opportunities for leaks of reactants to the atmosphere. Accordingly, there is a forced convection duct flow between the holders 44—44 which is controlled separately for each level by individually controlling the velocity and volume of reactant gases passing through the tubes 46, 47 and 48 and above the wafers 13—13.

Advantageously, due to the instant multilevel configuration it is possible for each production run to deposit doped silicon on several times the number of wafers 13, than the hereinbefore described systems. In multilevel apparatus 40 can replace a plurality of the reactors 12 and 20 shown in FIGS. 1 and 2, respectively, with less energy used per wafer 13 produced.

Furthermore, the resistance heated holders 44—44, being located above and below the wafers 13—13 provide heat by both conduction and radiation which minimizes the thermal stress which, in turn, minimizes axial temperature gradients resulting in virtually slip free wafers 13—13.

It is to be understood that the embodiments described herein are merely illustrative of the principles of the invention. Various modifications may be made thereto by persons skilled in the art which will embody the principles of the invention and wall fall within the spirit and scope thereof.

What is claimed is:

1. A method of depositing a thin film of a material on a plurality of semiconductor wafers, comprising the steps of:

placing the wafers on resistance heated portions on each of a plurality of vertically spaced, parallel, planar wafer holders, said heated portions being vertically aligned and the holders having a centrally disposed, perforated, tube passing therethrough;

directing a gaseous reactant material through the perforated tube, radially outward, between the wafer holders;

maintaining an individually controlled, forced convective flow of the gaseous reactants across each holder and the wafers thereon; and activating the resistance heated portions to conductively and radiatively heat the wafers on each holder to deposit a thin film of reactant material thereon.

2. The method as set forth in claim 1, characterized by:

maintaining the wafer holders and the perforated tube stationary during deposition of the reactants.

* * * * *